United States Patent
Lee et al.

(10) Patent No.: US 10,580,969 B2
(45) Date of Patent: Mar. 3, 2020

(54) ELECTRONIC DEVICE

(71) Applicants: SK hynix Inc., Gyeonggi-do (KR); Toshiba Memory Corporation, Tokyo (JP)

(72) Inventors: Tae-Young Lee, Gyeonggi-do (KR); Jae-Hyoung Lee, Gyeonggi-do (KR); Sung-Woong Chung, Gyeonggi-do (KR); Eiji Kitagawa, Tokyo (JP)

(73) Assignees: SK hynix Inc., Gyeonggi-do (KR); Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/209,684

(22) Filed: Dec. 4, 2018

(65) Prior Publication Data
US 2019/0173001 A1    Jun. 6, 2019

(30) Foreign Application Priority Data
Dec. 5, 2017    (KR) .................. 10-2017-0166067

(51) Int. Cl.
| | |
|---|---|
| *H01L 43/02* | (2006.01) |
| *H01L 43/12* | (2006.01) |
| *H01L 43/10* | (2006.01) |
| *G11C 11/16* | (2006.01) |
| *H01L 43/06* | (2006.01) |
| *H01L 43/08* | (2006.01) |
| *H01L 43/14* | (2006.01) |
| *H01L 43/04* | (2006.01) |

(Continued)

(52) U.S. Cl.
CPC ............ *H01L 43/02* (2013.01); *G11C 11/161* (2013.01); *H01L 43/04* (2013.01); *H01L 43/06* (2013.01); *H01L 43/065* (2013.01); *H01L 43/08* (2013.01); *H01L 43/10* (2013.01); *H01L 43/12* (2013.01); *H01L 43/14* (2013.01); *G11C 11/18* (2013.01); *G11C 11/22* (2013.01)

(58) Field of Classification Search
None
See application file for complete search history.

(56) References Cited

U.S. PATENT DOCUMENTS

| | | | |
|---|---|---|---|
| 6,946,697 B2 | 9/2005 | Pietambaram et al. | |
| 2013/0157383 A1* | 6/2013 | Cho ................. | H01L 43/12 438/3 |
| 2015/0255135 A1* | 9/2015 | Tran .................. | G11C 11/161 365/158 |

FOREIGN PATENT DOCUMENTS

KR    1020170057116    5/2017

* cited by examiner

*Primary Examiner* — Minh Loan Tran
(74) *Attorney, Agent, or Firm* — IP & T Group LLP

(57) ABSTRACT

An electronic device may include a semiconductor memory, and the semiconductor memory may include a first magnetic layer; a second magnetic layer; and a spacer layer interposed between the first magnetic layer and the second magnetic layer, wherein the spacer layer includes a first layer, a second layer and an intermediate layer interposed between the first layer and the second layer, and wherein each of the first layer and the second layer includes an oxide, or a nitride, or a combination of an oxide and a nitride, the intermediate layer includes a multilayer structure including $[Ru/x]_n$ or $[x/Ru]_n$, x includes a metal, an oxide, or a nitride, or a combination of a metal, an oxide and a nitride, and n represents an integer of 1 or greater.

20 Claims, 10 Drawing Sheets

(51) Int. Cl.
*G11C 11/18* (2006.01)
*G11C 11/22* (2006.01)

ELECTRONIC DEVICE

CROSS-REFERENCE TO RELATED APPLICATION

This patent document claims priority of Korean Patent Application No. 10-2017-0166067, entitled "ELECTRONIC DEVICE" and filed on Dec. 5, 2017, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element that exhibits different resistance states for storing data.

In one aspect, an electronic device may include a semiconductor memory, and the semiconductor memory may include a first magnetic layer; a second magnetic layer; and a spacer layer interposed between the first magnetic layer and the second magnetic layer, wherein the spacer layer includes a first layer, a second layer and an intermediate layer interposed between the first layer and the second layer, and wherein each of the first layer and the second layer includes an oxide, or a nitride, or a combination of an oxide and a nitride, the intermediate layer includes a multilayer structure including $[Ru/x]_n$ or $[x/Ru]_n$, x includes a metal, an oxide, or a nitride, or a combination of a metal, an oxide, and a nitride, and wherein n represents an integer of 1 or greater.

Implementations of the above electronic device may include one or more the following.

The first magnetic layer, the spacer layer and the second magnetic layer may form a synthetic anti-ferromagnet (SAF) structure. x may include a metal including Ir, Rh, Ta, Pt, Co, or Cr, or a combination thereof, an oxide including $CoO_y$, $FeO_y$, or $NiO_y$, or a combination thereof, or a nitride including CoN, FeN, NiN, or TaN, or a combination thereof. The spacer layer may have a thickness of 0.5 nm or more. The spacer layer may be structured to exhibit a desired exchange coupling characteristic at a greater thickness than a thickness of a Ru single layer used as the spacer layer to exhibit the desired exchange coupling characteristic. Each of the first magnetic layer and the second magnetic layer may have a fixed magnetization direction and magnetization directions of the first magnetic layer and the second magnetic layer are anti-parallel to each other. Each of the first magnetic layer and the second magnetic layer may include a single-layer or multilayer structure including a ferromagnetic material. The first magnetic layer may include a pinned layer having a fixed magnetization direction and the second magnetic layer may include a shift cancelling layer structured to offset or reduce an effect of a stray magnetic field produced by the pinned layer. The electronic device may further include a material layer which is interposed between the first magnetic layer and the second magnetic layer and structured to relax a strain from a difference in lattice structures and a lattice mismatch between the first magnetic layer and the second magnetic layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device may include a semiconductor memory, wherein the semiconductor memory may include: a magnetic tunnel junction (MTJ) structure including a free layer having a variable magnetization direction, a pinned layer having a fixed magnetization direction and a tunnel barrier layer interposed between the free layer and the pinned layer, wherein the free layer or the pinned layer includes a first magnetic layer, a second magnetic layer and a spacer layer interposed between the first magnetic layer and the second magnetic layer and are structured so that the first magnetic layer and the second magnetic layer are anti-ferromagnetic exchange coupled through the spacer layer, wherein the spacer layer includes a multilayer structure including $[Ru/x]_n$ or $[x/Ru]_n$ (where x includes a metal, an oxide, or a nitride, or a combination of a metal, an oxide and a nitride, and n represents an integer of 1 or greater.) and exhibits a desired exchange coupling characteristic at a greater thickness than a thickness of a Ru single layer used as the spacer layer to exhibit the desired exchange coupling characteristic.

Implementations of the above electronic device may include one or more the following.

x may include a metal including Ir, Rh, Ta, Pt, Co, or Cr, or a combination thereof, an oxide including $CoO_y$, $FeO_y$, or $NiO_y$, or a combination thereof, or a nitride including CoN, FeN, NiN, or TaN, or a combination thereof. The spacer layer may have a thickness of 0.5 nm or more. The spacer layer may further include a material layer which is disposed over the multilayer structure and include an oxide, or a nitride, or a combination thereof, and another material layer which is disposed under the multilayer structure and include an oxide, or a nitride, or a combination thereof. Any one of the first magnetic layer and the second magnetic layer which is disposed closer to the tunnel barrier layer may have a bcc (001) structure. The electronic device may further include a material layer which is interposed between the first magnetic layer and the second magnetic layer and structured to relax a strain from a difference in lattice structures and a lattice mismatch between the first magnetic layer and the second magnetic layer.

These and other aspects, implementations and associated advantages are described in greater detail in the drawings, the description and the claims.

DETAILED DESCRIPTION

Figure 1:
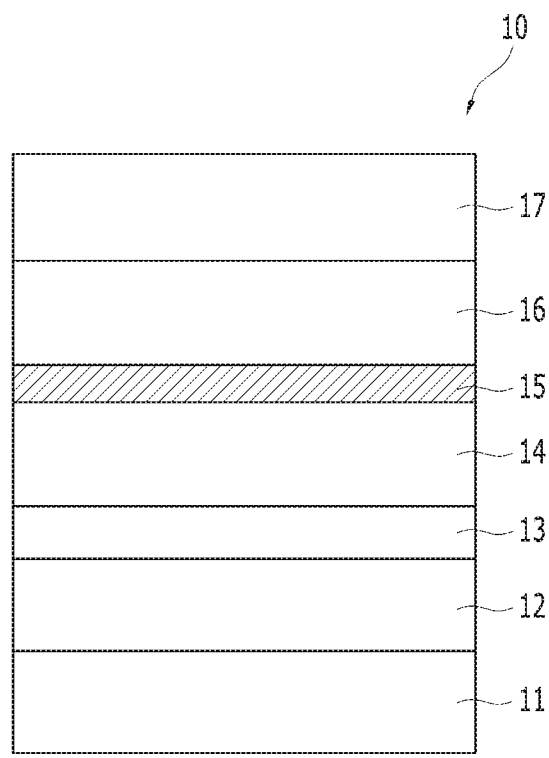
FIG. 1 is a cross-sectional view illustrating an example of a variable resistance element in accordance with a comparative example.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

Prior to explaining implementations of the disclosed technology, an example of a variable resistance element having a spacer layer with a small thickness is described with reference to FIG. 1.

FIG. 1 is a cross-sectional view illustrating the example of a variable resistance element 10 including a spacer layer 15 which is formed of a conductive material such as Ru.

Referring to FIG. 1, the variable resistance element 10 may include a Magnetic Tunnel Junction (MTJ) structure which includes a free layer 12 having a variable magnetization direction, a pinned layer 14 having a fixed magnetization direction and a tunnel barrier layer 13 interposed between the free layer 12 and the pinned layer 14.

The resistance in the electrical path across the MTJ structure exhibits a variable resistance with different resistance values depending on the relative direction between the magnetization directions of the free layer 12 and the pinned layer 14 on two sides of the tunnel barrier layer 13. The free layer 12 is structured to exhibit a variable magnetization direction that can be changed under an applied signal (e.g., a driving current above a certain threshold) to produce different magnetization states for the MTJ structure and may also be referred to as a storage layer.

The pinned layer 14 is structured to exhibit a fixed magnetization direction and may also be referred to as a reference layer. The free layer 12 and the pinned layer 14 may have a single-layer structure or a multi-layer structure that includes magnetic materials. The tunnel barrier layer 13 is interposed between the free layer 12 and the pinned layer 14 to allow the tunneling of electrons in both data reading and data writing operations. The tunnel barrier layer 13 may include an insulating oxide. The resistance in the electrical path across the MTJ structure exhibits a variable resistance with different resistance values depending on the relative direction between the magnetization directions of the free layer 12 and the pinned layer 14 on two sides of the tunnel barrier layer 13. Accordingly, the magnetization direction of the free layer 12 can be controlled to set the MTJ structure to exhibit different resistance values for storing different digital data. The change in the magnetization direction of the free layer 12 may be induced by spin transfer torque via a spin-polarized current that is directed to flow through the tunnel barrier layer 13 via the electron tunneling. In a read operation, a small read current is directed through the MTJ structure that does not change the magnetization direction of the free layer 12 to enable readout the resistance value of the MTJ structure at a given magnetization direction of the free layer 12. In a write operation, a sufficiently large spin-polarized write current is directed through the MTJ structure to produce a sufficiently high spin transfer torque to change the existing magnetization direction of the free layer 12, thus writing a new magnetization state in the MTJ structure.

In some implementations such as the example shown in FIG. 1, the variable resistance element 10 may further include one or more additional layers to improve characteristics of the MTJ structure. For example, the variable resistance element 10 may further include a shift cancelling layer (or shift adjustment layer) 16, a spacer layer 15, an under layer 11 disposed below the MTJ structure, or an upper layer 17 disposed over the MTJ structure, or others.

The shift cancelling layer 16 may be formed on one side of the MTJ structure, e.g., being located over the pinned layer 14 such that the shift cancelling layer 16 is located opposite to a surface on which the tunnel barrier layer 13 is formed. The shift cancelling layer 16 may be structured to produce a magnetization which serves to offset or reduce the effect of the stray magnetic field at the free layer 12 that is produced by the pinned layer 14. For example, the shift cancelling layer 16 may be structured to produce the magnetization at the free layer 12 with a magnetization direction that is opposite or anti-parallel to the magnetization direction of the pinned layer 14. The shift cancelling layer 16 may have a single-layer or multilayer structure including a ferromagnetic material. In some literature, the shift cancelling layer 16 may be referred to as a magnetic compensation or bias layer whose magnetization offsets against the stray magnetic field at the free layer 12 that is produced by the pinned layer 14.

In the example in FIG. 1, the spacer layer 15 is a conductive material and is interposed between the pinned layer 14 and the shift cancelling layer 16 and provide an anti-ferromagnetic exchange coupling between the pinned layer 14 and the shift cancelling layer 16.

In order to maintain a strong anti-ferromagnetic exchange coupling between the pinned layer 14 and the shift cancelling layer 16, the characteristics of the spacer layer 15 need to be sufficiently secured without being affected during the whole fabrication process of the variable resistance element 10. However, the spacer layer 15 which is formed in some other variable resistance element designs tends to include a conductive material such as Ru and such an MTJ is prone to changing its characteristics during the fabrication process of the variable resistance element 10 including a thermal treatment process to deteriorate the characteristics of the spacer layer 15. This is in part because that the spacer layer 15 in those other designs includes a conductive material such as Ru and has a relatively small thickness. Referring to FIG. 1, the spacer layer 15 may have a single-layer structure. Thus, the spacer layer 15 in the conventional variable resistance element can be easily intermixed with adjacent magnetic layers via material diffusion so that characteristics of the spacer layer 15 may be deteriorated due to the undesired material diffusion through a subsequent thermal treatment process. As a result, anti-ferromagnetic exchange coupling between the pinned layer 14 and the shift cancelling layer 16 may be weakened by deterioration of characteristics of the spacer layer 15, thereby lowering characteristics of the variable resistance element 10.

In recognition of the above, there is a need for a spacer layer which can sustain during the whole fabrication process of the variable resistance element 10 to provide and maintain a strong anti-ferromagnetic exchange coupling between the pinned layer 14 and the shift cancelling layer 16, thus improving the characteristics of the variable resistance element 10 over the life cycle of a memory device having variable resistance elements 10. In accordance with an implementation of the disclosed technology, a semiconductor memory is provided to achieve desired characteristics of the variable resistance element, for example, by including a spacer layer which has an improved thermal stability and is capable of suppressing interlayer mixing, thereby improving an anti-ferromagnetic exchange coupling strength.

Figure 2:
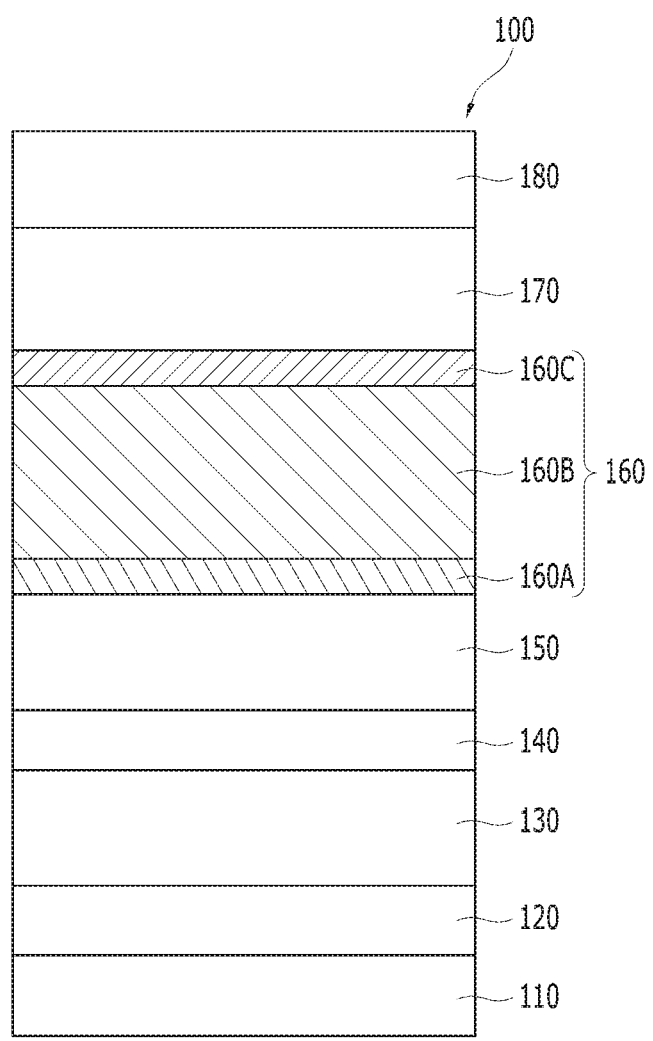
FIG. 2 is a cross-sectional view illustrating an example of a variable resistance element in accordance with an implementation of the disclosed technology.

FIG. 2 is a cross-sectional view illustrating an example of a variable resistance element in accordance with an implementation of the disclosed technology. The thin conductive spacer layer 15 in FIG. 1 is replaced by a composite spacer structure 160 in a multilayer structure in this example in FIG. 2 to mitigate the technical issues associated with the use of the thin conductive spacer layer 15 in FIG. 1.

Referring to FIG. 2, a variable resistance element 100 may include a magnetic tunnel junction (MTJ) structure which includes a free layer 130, a pinned layer 150 and a tunnel barrier layer 140.

The free layer 130, the pinned layer 150, and the tunnel barrier layer 140 collectively form part of an MTJ structure exhibiting variable resistance values for storing different data bits as explained above. The free layer 130 has a variable magnetization direction, the pinned layer 150 has a fixed magnetization direction, and the tunnel barrier layer 140 is interposed between the free layer 130 and the pinned layer 150 to allow the tunneling of electrons in both data reading and data writing operations.

The free layer 130 may have a variable magnetization direction that changes between different directions to cause the MTJ structure to have a variable resistance value. With the change of the magnetization direction of the free layer 130, the relative relationship of the magnetization directions of the free layer 130 and the pinned layer 150 also changes, which allows the variable resistance element 100 to store different data or represent different data bits. The free layer 130 may also be referred as a storage layer or the like. The magnetization direction of the free layer 130 may be substantially perpendicular to a surface of the free layer 130, the tunnel barrier layer 140 and the pinned layer 150. In other words, the magnetization direction of the free layer 130 may be substantially parallel to the stacking directions of the free layer 130, the tunnel barrier layer 140 and the pinned layer 150. Therefore, the magnetization direction of the free layer 130 may be changed between a downward direction and an upward direction. The change in the magnetization direction of the free layer 130 may be induced by spin transfer torque.

The free layer 130 may have a single-layer or multilayer structure including a ferromagnetic material. For example, the free layer 130 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or others, or may include a stack of metals, such as Co/Pt, or Co/Pd or others.

The tunnel barrier layer 140 may allow the tunneling of electrons in both data reading and data writing operations. In a write operation for storing new data, a high write current may be directed through the tunnel barrier layer 140 to change the magnetization direction of the free layer 130 and thus to change the resistance state of the MTJ for writing a new data bit. In a reading operation, a low reading current may be directed through the tunnel barrier layer 140 without changing the magnetization direction of the free layer 130 to measure the existing resistance state of the MTJ under the existing magnetization direction of the free layer 130 to read the stored data bit in the MTJ. The tunnel barrier layer 140 may include a dielectric oxide, for example, an oxide of a material such as Mg, Al, Ca, Sr, Ti, V, Nb, Y, Zn, or Sn or others, or a mixed oxide thereof.

The pinned layer 150 may have a pinned magnetization direction which contrasts with the magnetization direction of the free layer 130 and may be referred to as a reference layer or the like. In some implementations, the magnetization direction of the pinned layer 150 may be pinned in a downward direction. In some implementations, the magnetization direction of the pinned layer 150 may be pinned in an upward direction.

The pinned layer 150 may have a single-layer or multilayer structure including a ferromagnetic material. For example, the pinned layer 150 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or others, or may include a stack of metals, such as Co/Pt, or Co/Pd or others.

The magnetization directions of the free layer 130 and the pinned layer 150 may be substantially perpendicular to an interface of the layers, for example, an interface between the free layer 130 and the tunnel barrier layer 140. In some implementation, the variable resistance element 100 may include a perpendicular MD structure.

The variable resistance element 100 may store data by using different resistance states of the MD structure and may re-write stored data by switching between different resistance states according to a voltage or current applied to the variable element 100. To write new data at a memory cell with the MD-based variable resistance element 100, a write voltage or current is applied to the variable resistance element 100 to change the magnetization direction of the free layer 130 by spin torque transfer. When the magnetization directions of the free layer 130 and the pinned layer 150 are parallel to each other, the variable resistance element 100 may be in a low resistance state to store a designated digital data bit such as '0'. Conversely, when the magnetization directions of the free layer 130 and the pinned layer 150 are anti-parallel to each other, the variable resistance element 100 may be in a high resistance state to store a designated digital data bit such as '1'. In some implementations, the variable resistance element 100 can be configured to store data bit '1' when the magnetization directions of the free layer 130 and the pinned layer 150 are parallel to each other and to store data bit '0' when the magnetization directions of the free layer 130 and the pinned layer 150 are anti-parallel to each other.

In some implementations, the variable resistance element 100 may further include one or more layers performing various functions to improve a characteristic of the MTJ structure. For example, the variable resistance element 100 may further include a buffer layer 110, an under layer 120, a spacer layer 160, a shift cancelling layer 170 and a capping layer 180.

The buffer layer 110 may be disposed under the under layer 120 and aid in crystal growth of the under layer 120. When the buffer layer 110 is formed under the under layer 120, it is possible to aid in crystal growth of the under layer 120 and thus improve perpendicular magnetic crystalline anisotropy of the free layer 130. The buffer layer 110 may have a single-layer or multilayer structure including a metal, a metal alloy, a metal nitride, or a metal oxide, or a combination thereof.

The under layer 120 may be disposed under the free layer 130' and serve to improve perpendicular magnetic crystalline anisotropy of the free layer 130.

The under layer 120 may have a single-layer or multilayer structure including a metal, a metal alloy, a metal nitride, or a metal oxide, or a combination thereof.

The capping layer 180 may function as a hard mask for patterning the variable resistance element 100. In some implementations, the capping layer 180 may include various conductive materials such as a metal. In some implementations, the capping layer 180 may include a metallic material having almost none or a small number of pin holes and high resistance to wet and/or dry etching. In some implementations, the capping layer 180 may include a metal, a nitride or an oxide, or a combination thereof. For example, the capping layer 180 may include a noble metal such as ruthenium (Ru).

The shift cancelling layer 170 may be arranged between the capping layer 180 and the pinned layer 150 and be structured to produce a magnetization at the free layer 130 to offset or reduce the effect of the stray magnetic field produced by the pinned layer 150. In this case, the effect of the stray magnetic field of the pinned layer 150 can decrease, and thus a biased magnetic field in the free layer 130 can decrease. Thus, the shift cancelling layer 170 may be used to counter the undesired shift of the magnetization reversal characteristics (hysteresis curve) of the free layer 130 due to the stray magnetic field of the pinned layer 150. The shift cancelling layer 170 may have a magnetization direction anti-parallel to the magnetization direction of the pinned layer 150. In the implementation, when the pinned layer 150 has a downward magnetization direction, the shift cancelling layer 170 may have an upward magnetization direction. Conversely, when the pinned layer 150 has an upward magnetization direction, the shift cancelling layer 170 may have a downward magnetization direction. The shift cancelling layer 170 may form a synthetic anti-ferromagnet (SAF) structure with the pinned layer 150 and the spacer layer 160 by making the pinned layer 150 and the shift cancelling layer 170 anti-ferromagnetically coupled through the spacer layer 160. The shift cancelling layer 170 may have a single-layer or multilayer structure including a ferromagnetic material. The tunnel barrier layer 140 is located between the free layer 130 and the SAF structure including the shift cancelling layer 170, the pinned layer 150, and the spacer layer 160. The SAF structure including the pinned layer 150, the spacer layer 160 and the shift cancelling layer 170 will be further explained with reference to FIG. 3 in a later part of this patent document.

Moreover, a material layer may be provided to reduce, mitigate or relax a difference in lattice structures and a lattice mismatch between the pinned layer 150 and the shift cancelling layer 170 and may be interposed between the pinned layer 150 and the shift cancelling layer 170. The material layer may include an amorphous material, a conductive material, or others. The material layer may include a metal, a metal nitride or a metal oxide.

The spacer layer 160 may be interposed between the pinned layer 150 and the shift cancelling layer 170 and serve to implement or provide the SAF structure. In the implementation, the spacer layer 160 may have a multilayer structure including a first layer 160A, an intermediate layer 160B and a second layer 160C. With the multilayer structure, the spacer layer 160 may have a greater thickness than the spacer layer 15 as shown in FIG. 1.

The first layer 160A may be disposed closer to the pinned layer 150 than the second layer 160B is. The second layer 160E may be disposed closer to the shift cancelling layer 170 than the first layer 160A is. Each of the first layer 160A and the second layer 160B may include an oxide layer, or a nitride layer, or a combination thereof, to reduce the material diffusion and thus the undesired intermixing. In accordance with the implementation, the uppermost portion and the lowermost portion of the spacer layer 160, which correspond to the second layer 160B and the first layer 160A, respectively, include an oxide layer or a nitride layer, or a combination thereof to suppress intermixing with adjacent magnetic layers. Since the spacer layer 160 is not intermixed with adjacent magnetic layers with magnetic properties different from its own magnetic properties, the magnetic properties of the spacer layer 160 can be maintained without being affected from the adjacent magnetic layers. Thus, it is possible to improve a strength of an anti-ferromagnetic exchange coupling between the pinned layer 150 and the shift cancelling layer 170.

The intermediate layer 160B may be interposed between the first layer 160A and the second layer 160C and have a multilayer structure including $[Ru/x]_n$ or $[x/Ru]_n$. Ru has been known as a single material which has the greatest RKKY (Ruderman-Kittel-Kasuya-Yosida) interaction, allowing implementing an SAF structure. The element 'x' which is alternately stacked with Ru may include a metal, an oxide, or a nitride, or a combination thereof. In some implementations, the element 'x' may include a metal such as Ir, Rh, Ta, Pt, Co or Cr, an oxide such as $CoO_y$, $FeO_y$ or $NiO_y$, or a nitride such as CoN, FeN, NiN or TaN. The element 'n' may represent the number of times of lamination of layers (Ru layer and x layer) and be an integer greater than zero, i.e., 1 or an integer greater than 1. In the implementation, instead of a conventional Ru single layer having a thin thickness as a spacer for an anti-ferromagnetic exchange coupling, the variable resistance element 100 includes the spacer layer 160 having a multilayer structure including the first layer 160A, the intermediate layer 160B and the second layer 160C and the intermediate layer 160B includes a multilayer structure including $[Ru/x]_n$ or $[x/Ru]_n$. Therefore, the spacer layer 160 can have a greater thickness, thereby improving a thermal stability of the spacer layer 160.

It has been observed that the conventional spacer layer with a single-layer structure including Ru has the greatest strength of the exchange coupling at a thickness range of about 0.45 to 0.5 nm. The thickness range of about 0.45 to 0.5 nm of the conventional spacer layer may correspond to a peak range for the strength of the exchange coupling. The spacer layer 160 of the disclosed technology can exhibit the greatest exchange coupling strength at a thickness greater than the thickness range of about 0.45-0.5 nm. In some implementations of the disclosed technology, the spacer layer 160 may have a thickness of 0.5 nm or more. By increasing a thickness of the spacer layer 160, it is possible to suppress deterioration of characteristics of the spacer layer 160, which is caused due to a subsequent thermal treatment process. As a result, the spacer layer 160 can maintain its characteristics without being affected from the thermal treatment process and thus, a strength of an anti-ferromagnetic exchange coupling between the pinned layer 150 and the shift cancelling layer 170 can be improved.

In some implementations, in the variable resistance element 100 shown in FIG. 2, the relative positions of the pinned layer 150 and the shift cancelling layer 170 may be mutually changed. In this case, the pinned layer 150 may be located closer to the second layer 160C than the first layer 160A and the shift cancelling layer 170 may be located closer to the first layer 160A than the second layer 160C.

Figure 3:
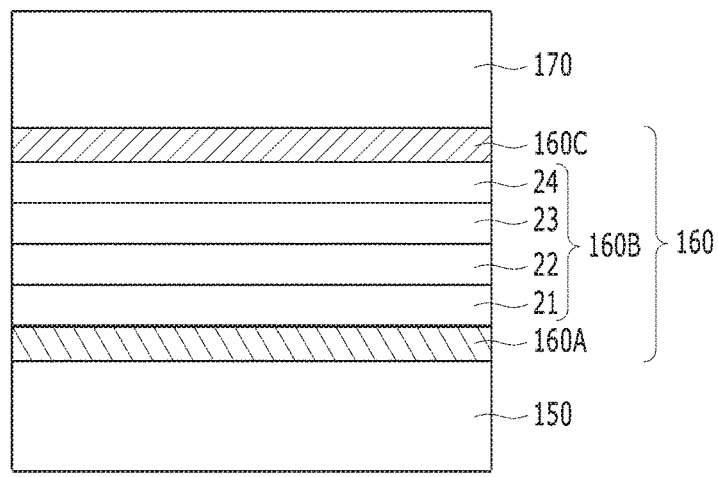
FIG. 3 is a cross-sectional view illustrating a part of the variable resistance element shown in FIG. 2.

An example of an SAF structure including the pinned layer 150, the spacer layer 160 and the shift cancelling layer 170 in accordance with the implementation will be explained in detail with reference to FIG. 3. FIG. 3 is a cross-sectional view illustrating a part of the variable resistance element shown in FIG. 2.

Referring to FIG. 3, the spacer layer 160 may be interposed between the pinned layer 150 and the shift cancelling layer 170 and include the first layer 160A, the intermediate layer 160B and the second layer 160C. The intermediate layer 160B may include layers 21, 22, 23 and 24. Each of the layers 21 and 23 may include Ru, while each of the layers 22 and 24 may include a metal, an oxide, or a nitride, or a combination thereof.

In the implementation shown in FIG. 3, the intermediate layer 1603 has a structure where a stack of a Ru layer and a layer including an element 'x' (which is referred to as an 'x' layer) is included twice. The disclosed technology is not limited thereto and other implementations are also possible. For example, in another implementation, the intermediate layer 1603 may have a structure where the stack of a Ru layer and an 'x' layer is included n times, when n may be an integer of 1 or larger.

As such, the spacer layer 160 of the disclosed technology has a different structure from the conventional spacer layer structured as a Ru single layer. The spacer layer 160 of the disclosed technology may have a multilayer structure including the first layer 160A, the intermediate layer 1603 and the second layer 160C and support an anti-ferromagnetic exchange coupling between the pinned layer 150 and shift cancelling layer 170. Further, the intermediate layer 160B may be formed to have a multilayer structure including [Ru/x]$_n$ or [x/Ru]$_n$, and the first layer 160A and the second layer 160C which are the uppermost portion and the lowermost portion of the spacer layer 160 may be formed of or including an oxide layer and/or a nitride layer. Therefore, it is possible to increase a thickness of the spacer layer 160, thereby improving a thermal stability of the spacer layer 160 and suppressing intermixing with adjacent magnetic layers. As a result, a strength of an anti-ferromagnetic exchange coupling between the pinned layer 150 and shift cancelling layer 170 can be improved.

In the implementations shown in FIGS. 2 and 3, the free layer 130 is formed under the pinned layer 150. The disclosed technology is not limited thereto and in another implementation, the free layer 130 may be formed over the pinned layer 150.

Figure 4:
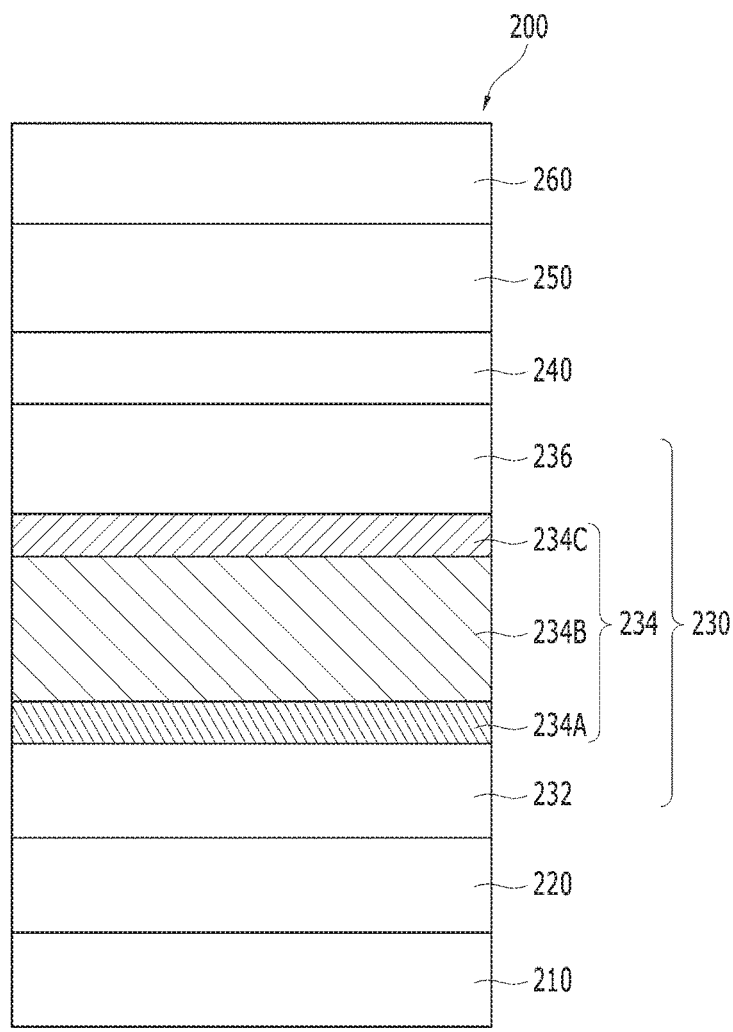
FIG. 4 is a cross-sectional view illustrating an example of a variable resistance element in accordance with another implementation of the disclosed technology.

FIG. 4 is a cross-sectional view illustrating a variable resistance element in accordance with another implementation of the disclosed technology. The description will be focused on a difference between the implementation shown in FIG. 2.

Referring to FIG. 4, a variable resistance element 200 may include a buffer layer 210, an under layer 220, a free layer 230, a tunnel barrier layer 240, a pinned layer 250 and a capping layer 260. The implementation shown in FIG. 4 is different from the implementation shown in FIG. 2 in that the free layer 230 has an SAF structure.

Figure 5:
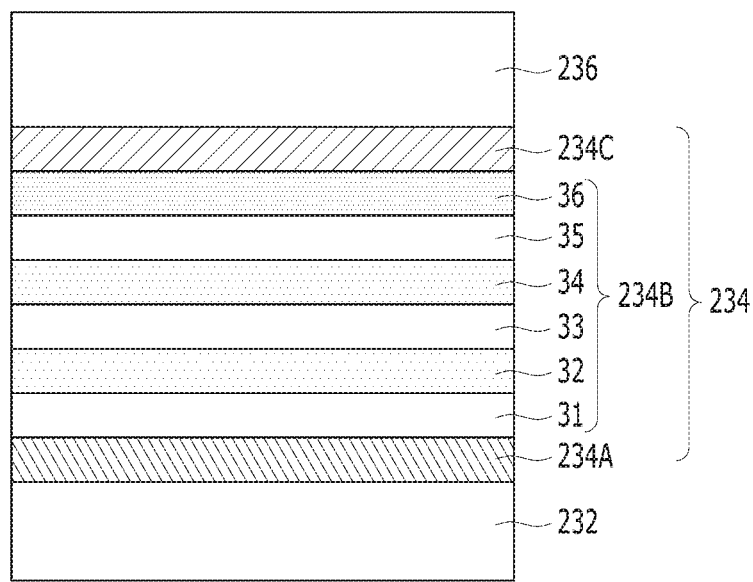
FIG. 5 is a cross-sectional view illustrating a part of the variable resistance element shown in FIG. 4.

In the implementation as illustrated in FIG. 5, the free layer 230 has a multi-layer structure. The free layer 230 may include a first magnetic layer 232, a spacer layer 234 and a second magnetic layer 236. The anti-ferromagnetic exchange coupling between the first magnetic layer 232 and the second magnetic layer 236 may be formed through the spacer layer 234.

The second magnetic layer 236 which substantially contribute to magnetoresistance (MR) may have a bcc (001) structure to improve MR in the exchange coupling multilayer structure. It is possible to secure a sufficient exchange coupling energy and improve MR by crystallizing the second magnetic layer 236 which is disposed closer to the tunnel barrier layer 240 in a bcc (001) direction.

Each of the first magnetic layer 232 and the second magnetic layer 236 may have a single-layer or multilayer structure including a ferromagnetic material. For example each of the first magnetic layer 232 and the second magnetic layer 236 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or others, or may include a stack of metals, such as Co/Pt, or Co/Pd or others.

Moreover, a material layer (not shown) for relaxing or relieving strain from a difference in lattice structures and a lattice mismatch between the first magnetic layer 232 and the second magnetic layer 236 may be interposed between the first magnetic layer 232 and the second magnetic layer 236. The material layer may include an amorphous material, a conductive material, or others. The material layer may include a metal, a metal nitride or a metal oxide.

The spacer layer 234 may include a first layer 234A, an intermediate layer 234B and a second layer 234C.

Each of the first layer 234A and the second layer 234C may include an oxide layer, or a nitride layer, or a combination thereof. The intermediate layer 234B may have a multilayer structure including [Ru/x]$_n$ or [x/Ru]$_n$. The element 'x' which is alternately stacked with Ru may include a metal, an oxide, or a nitride, or a combination thereof. In some implementations, the element 'x' may include a metal such as Ir, Rh, Ta, Pt, Co or Cr, an oxide such as CoO$_y$, FeO$_y$, or NiO$_y$, or a nitride such as CoN, FeN, NiN or TaN. The element 'n' may represent the number of times of lamination of layers (Ru layer and x layer) and be an integer of 1 or larger.

An example of the SAF structure including the first layer 232, the spacer layer 234 and the second layer 236 in accordance with the implementation will be explained in detail with reference to FIG. 5. FIG. 5 is a cross-sectional view illustrating a part of the variable resistance element shown in FIG. 4.

Referring to FIG. 5, the spacer layer 234 may be interposed between the first magnetic layer 232 and the second magnetic layer 236 and include the first layer 234A, the intermediate layer 234B and the second layer 234C. The intermediate layer 234B may include layers 31, 32, 33, 34, 35 and 36. Each of the layers 32, 34 and 36 may include Ru, while each of the layers 31, 33 and 35 may include a metal, an oxide, or a nitride, or a combination thereof.

In the implementation shown in FIG. 5, the intermediate layer 234B has a structure where a stack of a Ru layer and an 'x' layer is stacked three times. The disclosed technology is not limited thereto and other implementations are also possible. For example, in another implementation, the intermediate layer 234B may have a structure where the stack of a Ru layer and an 'x' layer is included n times, when n may be an integer of 1 or greater.

In the implementations shown in FIGS. 4 and 5, the spacer layer 234 can have a greater thickness, for example, a thickness of 0.5 nm or more. This thickness of the spacer layer 234 is greater than that of the conventional Ru single spacer layer. Accordingly, the spacer layer 234 of the disclosed technology can improve a thermal stability. Further, it is possible to suppress intermixing with adjacent magnetic layers and improve a strength of an anti-ferromagnetic exchange coupling by forming an oxide layer and/or a nitride layer at the uppermost portion and the lowermost portion of the spacer layer 234.

In the implementations shown in FIGS. 4 and 5, the free layer 230 is formed under the pinned layer 250. In another implementation, the free layer 230 may be formed over the pinned layer 250.

In the implementation shown in FIGS. 4 and 5, the free layer 230 has an SAF structure. In another implementation, the pinned layer 250 may have an SAF structure. In this case, the pinned layer 250 may include a first magnetic layer, a spacer layer and a second magnetic layer and an anti-ferromagnetic exchange coupling is formed between the first magnetic layer and the second magnetic layer through the spacer layer.

The effect obtained by an implementation in accordance with the disclosed technology is explained with reference to FIGS. 6A and 6B.

Figure 6A:
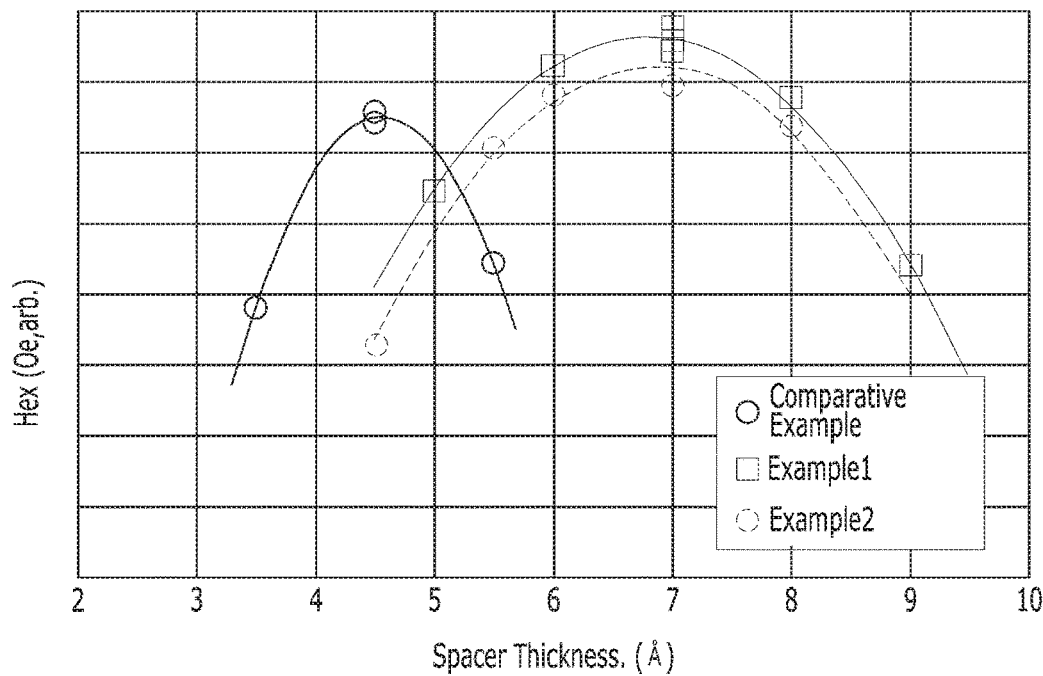
FIG. 6A is a graph showing an exchange coupling strength of synthetic anti-ferromagnet (SAF) structures in accordance with an implementation of the disclosed technology and a comparative example.
Figure 6B:
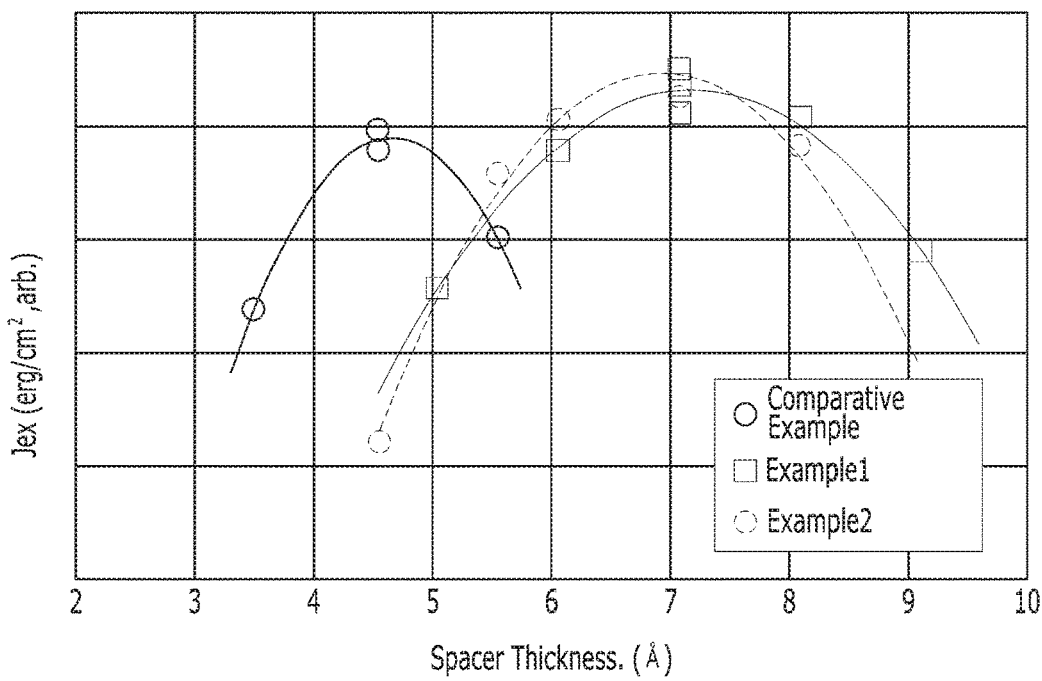
FIG. 6B is a graph showing an exchange coupling energy of synthetic anti-ferromagnet (SAF) structures in accordance with an implementation of the disclosed technology and a comparative example.

FIG. 6A is a graph showing an exchange coupling strength of synthetic anti-ferromagnet (SAF) structures in accordance with an implementation of the disclosed technology and a comparative example using the structure in FIG. 1 and FIG. 6B is a graph showing an exchange coupling energy of synthetic anti-ferromagnet (SAF) structures in accordance with an implementation of the disclosed technology and the comparative examples using the structure in FIG. 1. In particular, the vertical axis in FIG. 6A shows values indicating an exchange coupling field (Hex) and the vertical axis in FIG. 6B shows values indicating an exchange coupling energy density (Jex), while the horizontal axes in FIGS. 6A and 6B show a thickness of a spacer layer.

In FIGS. 6A and 6B, the comparative example represents an SAF structure which includes a pinned layer including a ferromagnetic material, a shift cancelling layer including a ferromagnetic material and a Ru single layer interposed between the pinned layer and the shift cancelling layer based on the structure shown in FIG. 1; the example 1 represents an SAF structure which includes a pinned layer including a ferromagnetic material, a shift cancelling layer including a ferromagnetic material and a spacer having a multilayer structure including oxide/[Ru/x]$_n$/oxide; and the example 2 represents an SAF structure which includes a pinned layer including a ferromagnetic material, a shift cancelling layer including a ferromagnetic material and a spacer having a multilayer structure including oxide/[x/Ru]$_n$/oxide. The element 'x' may include an oxide, or a nitride, or a combination thereof.

As shown in FIGS. 6A and 6B, the examples 1 and 2 including the spacer having a multilayer structure has an improved exchange coupling characteristic, that is, an improved exchange coupling strength and an improved exchange coupling energy compared to the comparative example including the Ru single layer spacer. Further, the examples 1 and 2 have the greatest values of the exchange coupling strength and the exchange coupling energy at a thickness range greater than 0.5 nm. Since the comparative example has the greatest values of the exchange coupling strength and the exchange coupling energy at a thickness range less than 0.5 nm, the peak thickness in the examples 1 and 2 is greater than the peak thickness in the example including the Ru single layer for the spacer.

As such, in accordance with the implementation, it is possible to increase a thickness of the spacer in the SAF structure compared to the conventional Ru single layer spacer. Therefore, a thermal stability of the spacer can be increased to avoid deterioration of characteristics during a subsequent thermal treatment process and suppress intermixing with adjacent layers. As a result, a strength of an exchange coupling in the SAF structure can be improved, thereby securing a superior device characteristic.

A semiconductor memory device as disclosed in this document may include a cell array of variable resistance elements 100 to store data. The semiconductor memory may further include various components such as lines, elements, etc. to drive or control each variable resistance element 100. This is exemplarily explained with reference to FIGS. 7A and 7B.

Figure 7A:
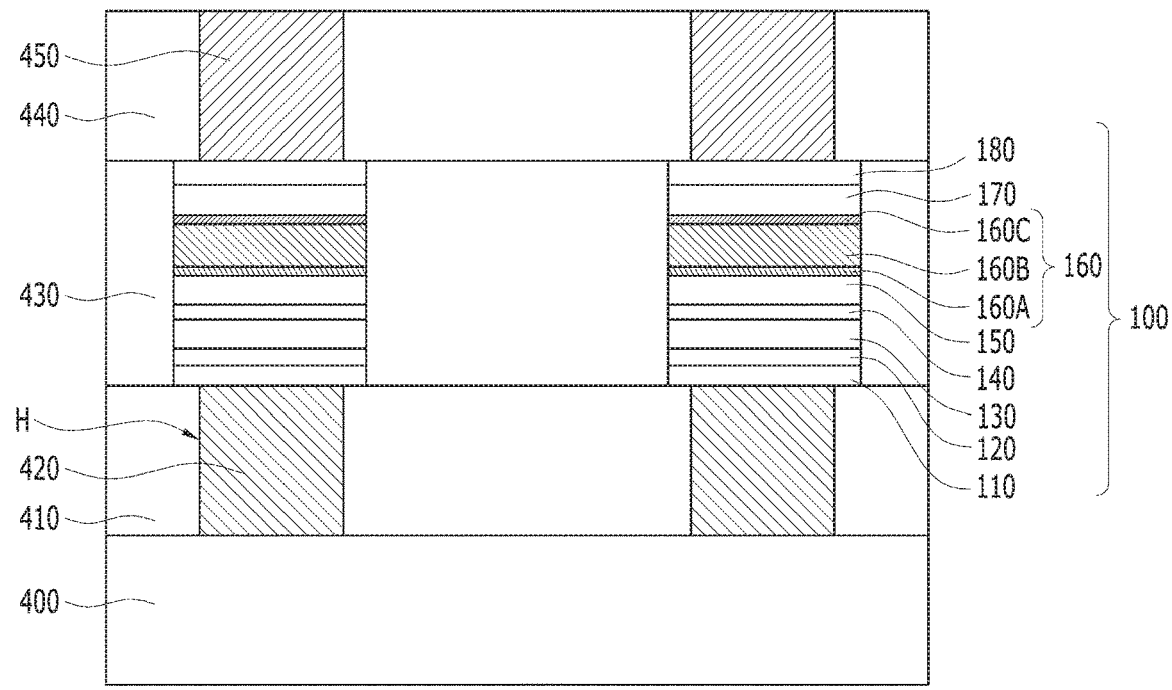
FIG. 7A is a cross-sectional view illustrating an exemplary memory device and a method for fabricating the same in accordance with an implementation of the disclosed technology.

FIG. 7A is a cross-sectional view for explaining a memory device and a method for fabricating the same in accordance with an implementation of the disclosed technology.

Referring to FIG. 7A, the memory device of the implementation may include a substrate 400, lower contacts 420 formed over the substrate 400, variable resistance elements 100 formed over the lower contacts 420 and upper contacts 350 formed over the variable resistance element 100. For each variable resistance element 100, a specific structure as a switch or switching circuit/element, for example, a transistor, for controlling an access to a particular variable resistance element 100 can be provided over the substrate 400 to control the variable resistance element 100, where the switch can be turned on to select the variable resistance element 100 or turned off to de-select the variable resistance element 100. The lower contacts 420 may be disposed over the substrate 400, and couple a lower end of the variable resistance element 100 to a portion of the substrate 400, for example, a drain of the transistor as the switching circuit for the variable resistance element 100. The upper contact 450 may be disposed over the variable resistance element 100, and couple an upper end of the variable resistance element 100 to a certain line (not shown), for example, a bit line. In FIG. 7A, two variable resistance elements 100 are shown as examples of the elements in an array of variable resistance elements 100.

The above memory device may be fabricated by following processes.

First, the substrate 400 in which the transistor or the like is formed may be provided, and then, a first interlayer dielectric layer 410 may be formed over the substrate 400. Then, the lower contact 320 may be formed by selectively etching the first interlayer dielectric layer 410 to form a hole H exposing a portion of the substrate 400 and filling the hole H with a conductive material. Then, the variable resistance element 100 may be formed by forming material layers for the variable resistance element 100 over the first interlayer dielectric layer 410 and the lower contact 420, and selectively etching the material layers. The etch process for forming the variable resistance element 100 may include the IBE method which has a strong physical etching characteristic. Then, a second interlayer dielectric layer 430 may be formed to cover the variable resistance element. Then, a third interlayer dielectric layer 440 may be formed over the variable resistance element 100 and the second interlayer dielectric layer 430, and then upper contacts 450 passing through the third interlayer dielectric layer 440 and coupled to an upper end of the variable resistance element 100 may be formed.

In the memory device in accordance with this implementation, all layers forming the variable resistance element 100 may have sidewalls which are aligned with one another. That is because the variable resistance element 100 is formed through an etch process using one mask.

Unlike the implementation of FIG. 7A, a part of the variable resistance element 100 may be patterned separately from other parts. This process is illustrated in FIG. 7B.

Figure 7B:
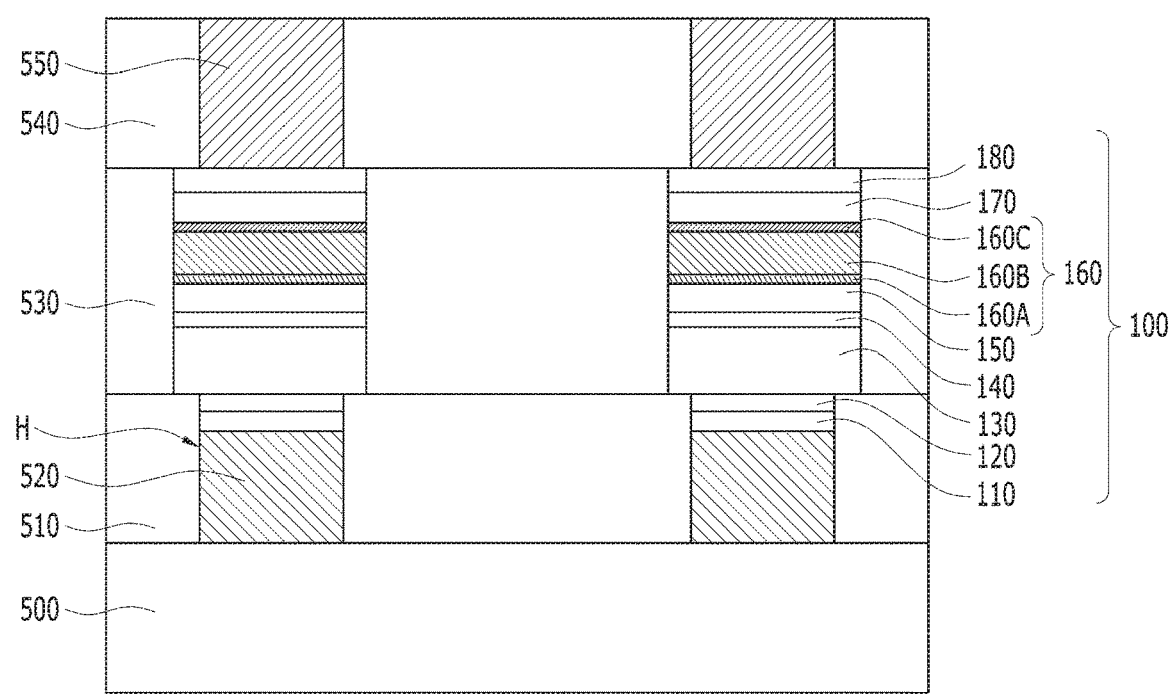
FIG. 7B is a cross-sectional view illustrating another exemplary memory device and a method for fabricating the same in accordance with an implementation of the disclosed technology.

FIG. 7B is a cross-sectional view for explaining a memory device and a method for fabricating the same in accordance with another implementation of the disclosed technology. The following descriptions will be focused on a difference from the implementation of FIG. 7A.

Referring to FIG. 7B, the memory device in accordance with this implementation may include a variable resistance element 100 of which parts, for example, a buffer layer 110 and a under layer 120, have sidewalls that are not aligned with other layers thereof. As shown in FIG. 7B, the buffer layer 110 and the under layer 120 may have sidewalls which are aligned with lower contacts 520.

The memory device in FIG. 7B may be fabricated by following processes.

First, a first interlayer dielectric layer 510 may be formed over a substrate 500, and then selectively etched to form a hole H exposing a portion of the substrate 500. The, the lower contacts 520 may be formed to fill a lower portion of the hole H. For example, the lower contacts 520 may be formed through a series of processes of forming a conductive material to cover the resultant structure having the hole formed therein and removing a part of the conductive material through an etch back process or the like until the conductive material has a desired thickness. Then, the buffer layer 110 and an under layer 120 may be formed so as to fill the remaining portion the hole H. For example, the buffer layer 110 may be formed by forming a material layer for forming the buffer layer 110 which covers the resultant structure in which the lower contacts 520 is formed, and then removing a portion of the material layer by, for example, an etch-back process until the material layer has a desired thickness. Moreover, the under layer 120 may be formed by forming a material layer for forming the under layer 120 which covers the resultant structure in which the lower contacts 520 and the buffer layer 110 are formed, and then performing a planarization process such as a CMP (Chemical Mechanical Planarization) until a top surface of the first interlayer dielectric layer 510 is exposed. Then, the remaining parts of the variable resistance element 100 may be formed by forming material layers for forming the remaining layers of the variable resistance element 100 except the buffer layer 110 and the under layer 120 over the lower contacts 520 and the first interlayer dielectric layer 510.

Subsequent processes are substantially the same as those as shown in FIG. 7A.

In this implementation, the height which needs to be etched at a time in order to form the variable resistance element 100 can be reduced, which makes it possible to lower the difficulty level of the etch process.

Although in this implementation, the buffer layer 110 and the under layer 120 are buried in the hole H, other parts of the variable resistance element 100 may also be buried as needed.

The above and other memory circuits or semiconductor devices based on the disclosed technology can be used in a range of devices or systems. FIGS. 8 to 12 provide some examples of devices or systems that can implement the memory circuits disclosed herein.

Figure 8:
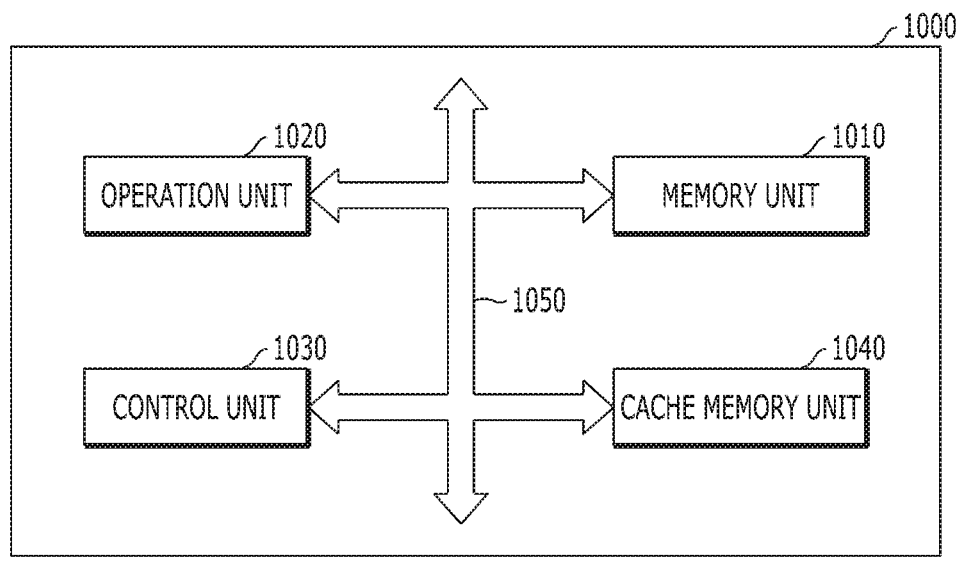
FIG. 8 is an example of configuration diagram of a microprocessor implementing memory circuitry based on an implementation of the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first magnetic layer; a second magnetic layer; and a spacer layer interposed between the first magnetic layer and the second magnetic layer, wherein the spacer layer includes a first layer, a second layer and an intermediate layer interposed between the first layer and the second layer, and wherein each of the first layer and the second layer includes an oxide, or a nitride, or a combination of an oxide and a nitride, the intermediate layer includes a multilayer structure including $[Ru/x]_n$ or $[x/Ru]_n$, x includes a metal, an oxide, or a nitride, or a combination of a metal, an oxide and a nitride, and n represents an integer of 1 or greater. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
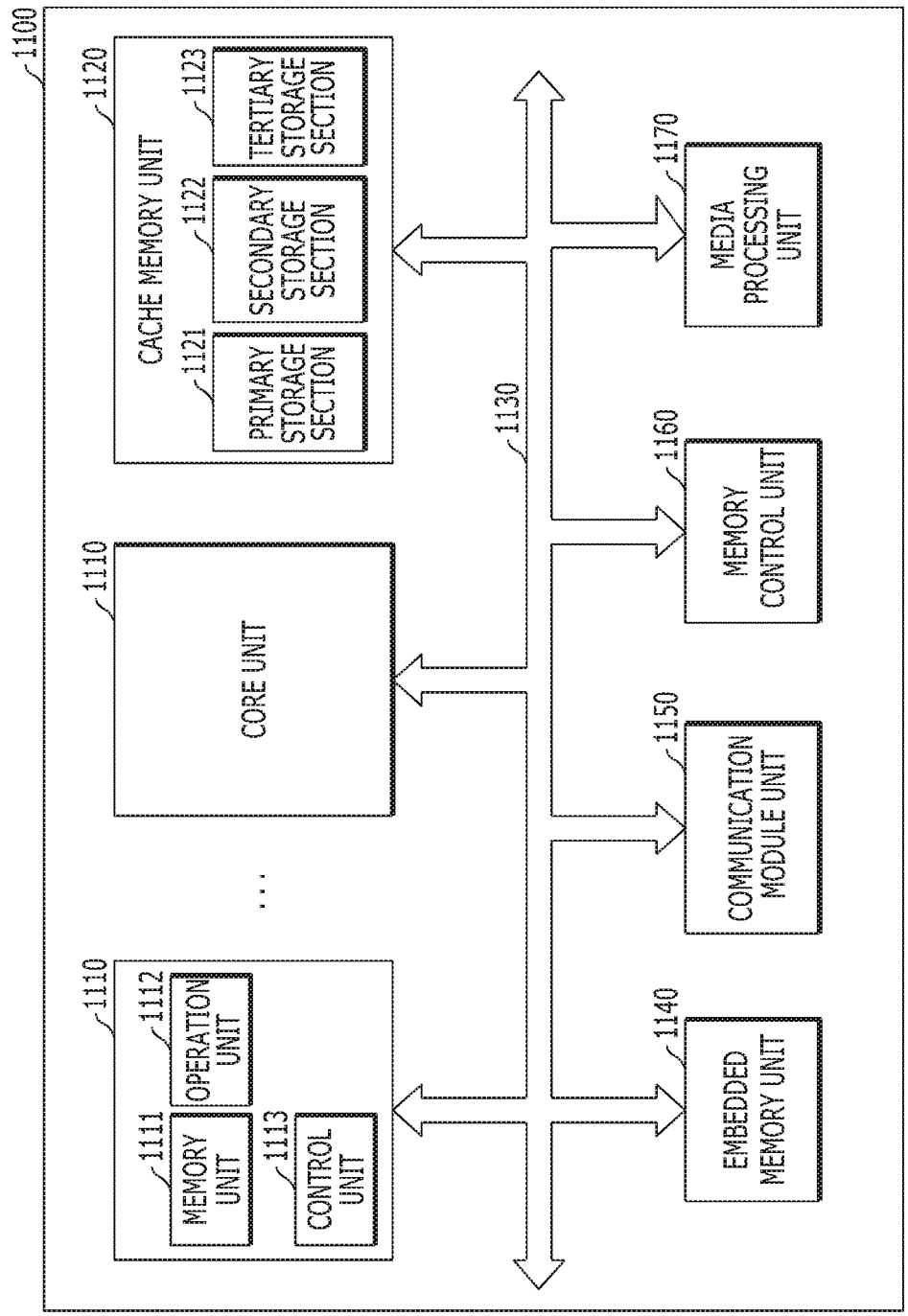
FIG. 9 is an example of configuration diagram of a processor implementing memory circuitry based on an implementation of the disclosed technology.

FIG. 9 is an example of configuration diagram of a processor implementing memory circuitry based on an implementation of the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first magnetic layer; a second magnetic layer; and a spacer layer interposed between the first magnetic layer and the second magnetic layer, wherein the spacer layer includes a first layer, a second layer and an intermediate layer interposed between the first layer and the second layer, and wherein each of the first layer and the second layer includes an oxide, or a nitride, or a combination of an oxide and a nitride, the intermediate layer includes a multilayer structure including $[Ru/x]_n$ or $[x/Ru]_n$, x includes a metal, an oxide, or a nitride, or a combination of a metal, an oxide and a nitride, and n represents an integer of 1 or greater. Through this, data storage characteristics of the cache memory unit 1120 may be improved. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
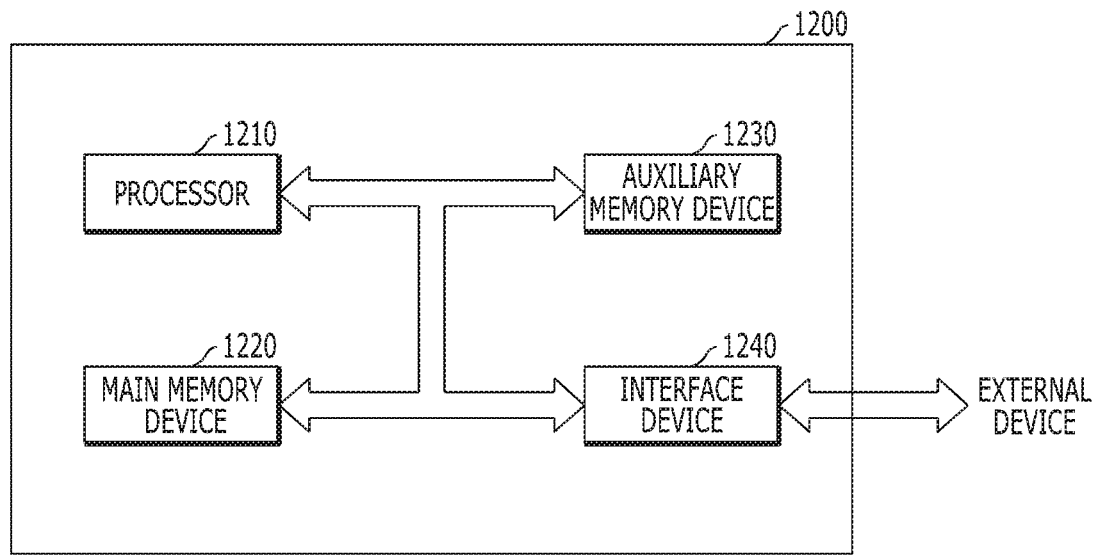
FIG. 10 is an example of configuration diagram of a system implementing memory circuitry based on an implementation of the disclosed technology.

FIG. 10 is an example of configuration diagram of a system implementing memory circuitry based on an implementation of the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include a first magnetic layer; a second magnetic layer; and a spacer layer interposed between the first magnetic layer and the second magnetic layer, wherein the spacer layer includes a first layer, a second layer and an intermediate layer interposed between the first layer and the second layer, and wherein each of the first layer and the second layer includes an oxide, or a nitride, or a combination of an oxide and a nitride, the intermediate layer includes a multilayer structure including $[Ru/x]_n$ or $[x/Ru]_n$, x includes a metal, an oxide, or a nitride, or a combination of a metal, an oxide and a nitride, and n represents an integer of 1 or greater. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first magnetic layer; a second magnetic layer; and a spacer layer interposed between the first magnetic layer and the second magnetic layer, wherein the spacer layer includes a first layer, a second layer and an intermediate layer interposed between the first layer and the second layer, and wherein each of the first layer and the second layer includes an oxide, or a nitride, or a combination of an oxide and a nitride, the intermediate layer includes a multilayer structure including $[Ru/x]_n$ or $[x/Ru]_n$, x includes a metal, an oxide, or a nitride, or a combination of a metal, an oxide and a nitride, and n represents an integer of 1 or greater. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (TDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
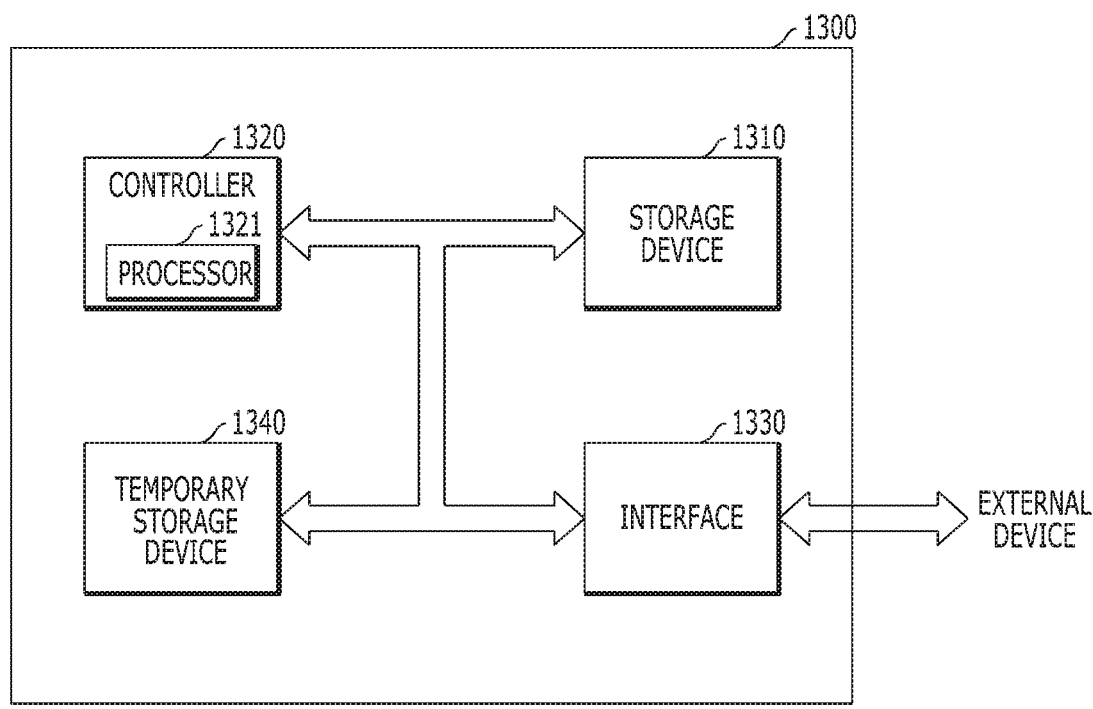
FIG. 11 is an example of configuration diagram of a data storage system implementing memory circuitry based on an implementation of the disclosed technology.

FIG. 11 is an example of configuration diagram of a data storage system implementing memory circuitry based on an implementation of the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first magnetic layer; a second magnetic layer; and a spacer layer interposed between the first magnetic layer and the second magnetic layer, wherein the spacer layer includes a first layer, a second layer and an intermediate layer interposed between the first layer and the second layer, and wherein each of the first layer and the second layer includes an oxide, or a nitride, or a combination of an oxide and a nitride, the intermediate layer includes a multilayer structure including $[Ru/x]_n$ or $[x/Ru]_n$, x includes a metal, an oxide, or a nitride, or a combination of a metal, an oxide and a nitride, and n represents an integer of 1 or greater. Through this, data storage characteristics of the storage device 1310 or the temporary storage device 1340 may be improved. As a consequence, operating characteristics and data storage characteristics of the data storage system 1300 may be improved.

Figure 12:
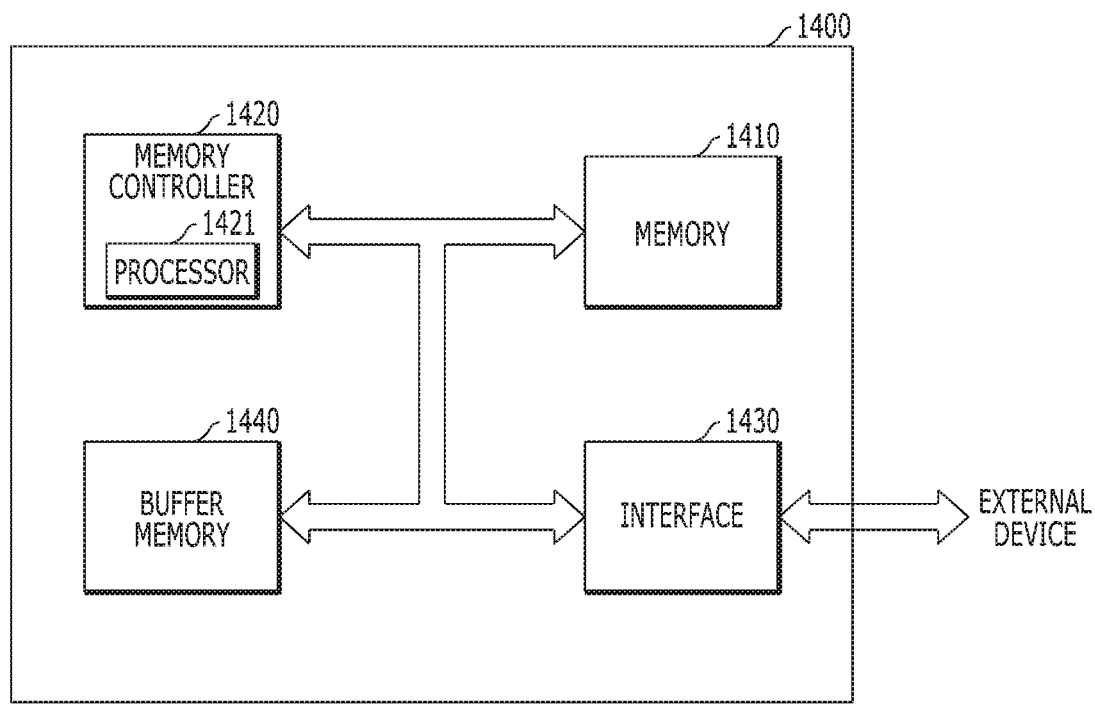
FIG. 12 is an example of configuration diagram of a memory system implementing memory circuitry based on an implementation of the disclosed technology.

FIG. 12 is an example of configuration diagram of a memory system implementing memory circuitry based on an implementation of the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include may include a first magnetic layer; a second magnetic layer; and a spacer layer interposed between the first magnetic layer and the second magnetic layer, wherein the spacer layer includes a first layer, a second layer and an intermediate layer interposed between the first layer and the second layer, and wherein each of the first layer and the second layer includes an oxide, or a nitride, or a combination of an oxide and a nitride, the intermediate layer includes a multilayer structure including $[Ru/x]_n$ or $[x/Ru]_n$, x includes a metal, an oxide, or a nitride, or a combination of a metal, an oxide and a nitride, and n represents an integer of 1 or greater. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include may include a first magnetic layer; a second magnetic layer; and a spacer layer interposed between the first magnetic layer and the second magnetic layer, wherein the spacer layer includes a first layer, a second layer and an intermediate layer interposed between the first layer and the second layer, and wherein each of the first layer and the second layer includes an oxide, or a nitride, or a combination of an oxide and a nitride, the intermediate layer includes a multilayer structure including $[Ru/x]_n$ or $[x/Ru]_n$, x includes a metal, an oxide, or a nitride, or a combination of a metal, an oxide and a nitride, and n represents an integer of 1 or greater. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
   a first magnetic layer;
   a second magnetic layer; and
   a spacer layer interposed between the first magnetic layer and the second magnetic layer,
   wherein the spacer layer includes a first layer, a second layer and an intermediate layer interposed between the first layer and the second layer, and
   wherein each of the first layer and the second layer includes an oxide or a nitride, or a combination of an oxide and a nitride, the intermediate layer includes a multilayer structure including $[Ru/x]_n$ or $[x/Ru]_n$, wherein x includes a metal, an oxide, or a nitride, or a combination of a metal, an oxide, and a nitride, and wherein n represents an integer of 1 or greater.

2. The electronic device of claim 1, wherein the first magnetic layer, the spacer layer and the second magnetic layer form synthetic anti-ferromagnet (SAF) structure.

3. The electronic device of claim 1, wherein x includes a metal including Ir, Rh, Ta, Pt, Co, or Cr, or a combination thereof, an oxide including $CoO_y$, $FeO_y$, or $NiO_y$, or a combination thereof, or a nitride including CoN, FeN, NiN, or TaN, or a combination thereof.

4. The electronic device of claim 1, wherein the spacer layer has a thickness of 0.5 nm or more.

5. The electronic device of claim 1, wherein the spacer layer is structured to exhibit a desired exchange coupling characteristic at a greater thickness than a thickness of a Ru single layer used as the spacer layer to exhibit the desired exchange coupling characteristic.

6. The electronic device of claim 1, wherein each of the first magnetic layer and the second magnetic layer has a fixed magnetization direction and magnetization directions of the first magnetic layer and the second magnetic layer are anti-parallel to each other.

7. The electronic device of claim 1, wherein each of the first magnetic layer and the second magnetic layer includes a single-layer or multilayer structure including a ferromagnetic material.

8. The electronic device of claim 1, wherein the first magnetic layer includes a pinned layer having a fixed magnetization direction and the second magnetic layer includes a shift cancelling layer structured to offset or reduce an effect of a stray magnetic field produced by the pinned layer.

9. The electronic device of claim 1 further comprising a material layer which is interposed between the first magnetic layer and the second magnetic layer and structured to relax a strain from a difference in lattice structures and a lattice mismatch between the first magnetic layer and the second magnetic layer.

10. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

11. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

12. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

13. The electronic device according to claim 1, further comprising a data storage system which includes:
a storage device configured to store data and conserve stored data regardless of power supply;
a controller configured to control input and output of data to and from the storage device according to a command inputted from an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

14. The electronic device according to claim 1, further comprising a memory system which includes:
a memory configured to store data and conserve stored data regardless of power supply;
a memory controller configured to control input and output of data to and from the memory according to a command inputted from an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

15. An electronic device comprising a semiconductor memory, wherein the semiconductor memory includes magnetic tunnel junction (MTJ) structure including a free layer having a variable magnetization direction, a pinned layer having a fixed magnetization direction and a tunnel barrier layer interposed between the free layer and the pinned layer,
wherein the free layer or the pinned layer includes a first magnetic layer, a second magnetic layer and a spacer layer interposed between the first magnetic layer and the second magnetic layer and are structured so that the first magnetic layer and the second magnetic layer are anti-ferromagnetic exchange coupled through the spacer layer,
wherein the spacer layer includes a multilayer structure including $[Ru/x]_x$ or $[x/Ru]_n$ (where x includes a metal, an oxide, or a nitride, or a combination of a metal, an oxide and a nitride, and n represents an integer of 1 or greater) and exhibits a desired exchange coupling characteristic at a greater thickness than a thickness of a Ru single layer used as the spacer layer to exhibit the desired exchange coupling characteristic.

16. The electronic device of claim 15, wherein x includes a metal including Ir, Rh, Ta, Pt, Co, or Cr, or a combination thereof, an oxide including $CoO_y$, $FeO_y$, or $NiO_y$, or a combination thereof, or a nitride including CoN, FeN, NiN, or TaN, or a combination thereof.

17. The electronic device of claim 15, wherein the spacer layer has a thickness of 0.5 nm or more.

18. The electronic device of claim 15, wherein the spacer layer further includes a material layer which is disposed over the multilayer structure and include an oxide, or a nitride, or a combination thereof, and another material layer which is disposed under the multilayer structure and include an oxide, or a nitride, or a combination thereof.

19. The electronic device of claim 15, wherein any one of the first magnetic layer and the second magnetic layer which is disposed closer to the tunnel barrier layer has a bcc (001) structure.

20. The electronic device of claim 15, further comprising a material layer which is interposed between the first magnetic layer and the second magnetic layer and structured to relax a strain from a difference in lattice structures and a lattice mismatch between the first magnetic layer and the second magnetic layer.

\* \* \* \* \*